(12) United States Patent
Sikina et al.

(10) Patent No.: US 11,336,032 B2
(45) Date of Patent: May 17, 2022

(54) REACTIVE ARRAY

(71) Applicant: Raytheon Company, Waltham, MA (US)

(72) Inventors: Thomas V. Sikina, Acton, MA (US); John P. Haven, Lowell, MA (US); Channing P. Favreau, Barre, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/874,790

(22) Filed: May 15, 2020

(65) Prior Publication Data

US 2021/0359429 A1 Nov. 18, 2021

(51) Int. Cl.
| | |
|---|---|
| *H01Q 1/22* | (2006.01) |
| *H01Q 23/00* | (2006.01) |
| *H01L 23/66* | (2006.01) |
| *H01Q 1/48* | (2006.01) |
| *H01Q 9/04* | (2006.01) |

(52) U.S. Cl.
CPC .............. *H01Q 23/00* (2013.01); *H01L 23/66* (2013.01); *H01Q 1/48* (2013.01); *H01Q 9/0407* (2013.01); *H01L 2223/6683* (2013.01)

(58) Field of Classification Search
CPC ........ H01Q 1/22; H01Q 9/0407; H01Q 23/00; H01L 23/66; H01L 2223/6683
See application file for complete search history.

(56) References Cited

U.S. PATENT DOCUMENTS

| | | | |
|---|---|---|---|
| 5,903,239 A | 5/1999 | Takahashi et al. | |
| 7,372,149 B2* | 5/2008 | Yamamoto | H01L 23/66 |
| | | | 257/728 |
| 8,867,226 B2 | 10/2014 | Tyhach et al. | |
| 9,245,859 B2* | 1/2016 | Fujita | H01L 23/13 |
| 2008/0315991 A1 | 12/2008 | Tuttle | |
| 2013/0181874 A1 | 7/2013 | Park et al. | |
| 2014/0008773 A1* | 1/2014 | Yen | H01L 25/0652 |
| | | | 257/664 |
| 2014/0140031 A1* | 5/2014 | Fujita | H05K 1/144 |
| | | | 361/803 |
| 2014/0145316 A1* | 5/2014 | Fujita | H01Q 9/0407 |
| | | | 257/664 |
| 2014/0239427 A1* | 8/2014 | Huang | H01L 21/486 |
| | | | 257/428 |
| 2016/0049723 A1* | 2/2016 | Baks | H01Q 1/2291 |
| | | | 343/848 |
| 2018/0166404 A1 | 6/2018 | Hu et al. | |
| 2021/0050312 A1* | 2/2021 | Franson | H01Q 1/38 |

OTHER PUBLICATIONS

U.S. Appl. No. 16/874,794, filed May 15, 2020, Sikina et al.

(Continued)

*Primary Examiner* — Hasan Z Islam
(74) *Attorney, Agent, or Firm* — Daly Crowley Mofford & Durkee, LLP

(57) ABSTRACT

Methods and apparatus for providing a radiator having an antenna comprising a patch antenna layer and a first ground plane layer, wherein the antenna has a reactive field region of the radiator between the patch antenna layer and the first ground plane layer, and an integrated circuit located in the active region.

15 Claims, 16 Drawing Sheets

(56) References Cited

OTHER PUBLICATIONS

International Search Report and Written Opinion dated May 19, 2021 for International Application No. PCT/US2021/014263; 15 Pages.
Response (with English Translation) to Taiwan Office Action dated Nov. 22, 2021 for Taiwan Application No. 110103470; Response filed Jan. 21, 2022; 14 Pages.
Taiwan Office Action (with English Translation) dated Nov. 22, 2021 for Taiwan Application No. 110103470; 12 Pages.
$2^{nd}$ Taiwan Office Action (with English Translation) dated Feb. 25, 2022 for Taiwan Application No. 110103470; 12 Pages.

\* cited by examiner

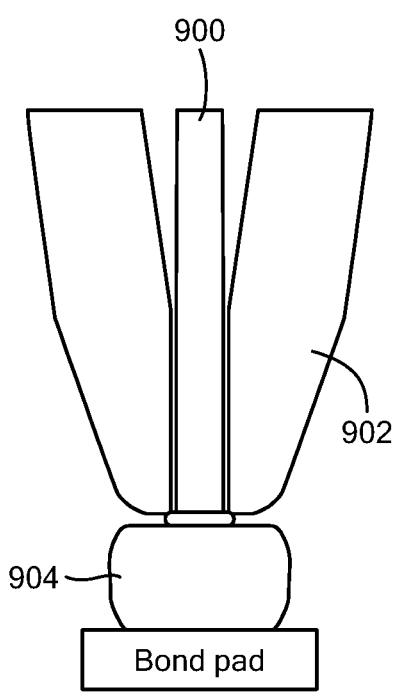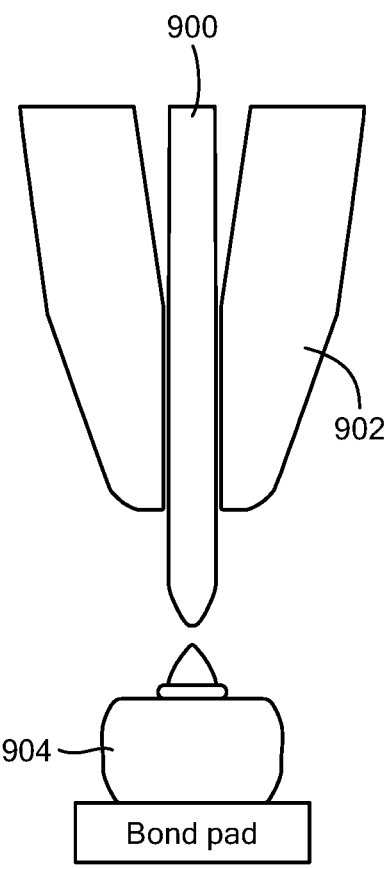
*FIG. 9A*　　　*FIG. 9B*

REACTIVE ARRAY

BACKGROUND

As is known in the art, a plurality of antenna elements can be disposed to form an array antenna. It is often desirable to utilize antenna elements capable of receiving radio frequency (RF) signals. Patch radiators may be used and are low cost and easy to integrate. In addition, patch radiators may be useful when thin, low weight radiators are desirable. Conventional radiators receive signals from front-end circuitry on circuit board layers connected to the radiators by via connections, for example. As capability and components increase the circuit board layers become crowded and component density reaches a limit. Placing components in the patch area can reduce density on the circuit board allowing for more capability. Such via connections are not lossless and may not provide suitable propagation characteristics without proper design. In addition, via connections between board layers may present challenging fabrication issues.

As is known in the art, microwave circuits may suffer from performance issues due to higher order coupling modes. In a stripline architecture these are dealt with using plated vias that connect ground plane to ground plane. In a microstrip assembly with a conductive lid it is not possible to use plated through hole vias. Prior attempts to deal with the high-order mode coupling include inserting thin absorber layers into the microwave PCB assembly, introducing absorber blocks, increasing the separation between microwave and MMICs, and reducing amplifier gain. These methods can provide some performance improvements, but have disadvantages in that they are trial-and-error methods that are not deterministic. As a result, complex microwave circuits often encounter coupling problems that delay design and manufacturing cycles. Absorber blocks may introduce loss in critical circuits, have considerable unit-to-unit variability, and may not be completely effective. Increasing separation between critical MMICs is generally not practical for high frequency or advanced circuits because of limited real estate, creates new overcrowding PCB layout conditions, and is not always effective. Reducing the amplifier gain degrades overall system performance, increases the risk of manufacturing defects, and limits performance improvements.

SUMMARY

Embodiments of the invention provide methods and apparatus for a reactive field array having front-end microwave components within a radiator, such as a patch radiator. The connection from the radiating element and circuitry is essentially lossless. In embodiments, circuitry is provided in MMICs, which may be bare die configurations eliminating package cost and loss. In embodiments, the electrical path length from the radiator port to the first receive amplifier is essentially zero thereby achieving minimal front-end loss. Housing front-end MMICs within the radiator's reactive fields reduces size and weight reduce to unprecedented levels.

In some embodiments, known mode suppression techniques can be used. In some embodiments, radiators include high-order mode suppression by including shorting posts in a cavity beneath the patch conductor having MMICs or other circuits.

In embodiments, a cavity containing a PCB includes a series of shorting posts located to achieve high order mode suppression in the cavity. The cavity can include a first ground plane that can be considered a bottom ground plane and a second ground plane that can be considered a top ground plane. The cavity can be defined by conductive walls at edges of the cavity. One or more ICs can be mounted on a surface of the PCB. The shorting posts can extend from the second ground plane into the cavity for suppressing higher order modes.

In one aspect, a radiator comprises: an antenna comprising a patch antenna layer and a first ground plane layer, wherein the antenna has a reactive field region of the radiator between the patch antenna layer and the first ground plane layer; and an integrated circuit located in the active region.

A radiator can include one or more of the following features: the integrated circuit comprises a monolithic microwave integrated circuit (MMIC), the MMIC is bare die, the MMIC does not have any wirebond connections, the integrated circuit comprises a (MMIC), wherein the MMIC can comprise a power amplifier, RF switch, low noise amplifier, phase shifter, and/or digital attenuator, a logic layer, wherein the logic layer is connected to the MMIC, the logic layer is connected to the MMIC with a via, a second ground layer, wherein the second ground layer is connected to the patch antenna layer, the second ground layer is connected to the patch antenna layer by a via, the radiator has a thickness of less than or equal to about 2.2 mm, the radiator comprises the antenna, a paint layer on the patch antenna, the integrated circuit including at least one MMIC, a bond film, a laminate layer, a second ground plane layer, a logic layer, and a structural carrier layer, and/or the radiator has a density of less than about 2.0 Kg/m$^2$.

In another aspect, a method comprises: employing an antenna comprising a patch antenna layer and a first ground plane layer, wherein the antenna has a reactive field region of the radiator between the patch antenna layer and the first ground plane layer, wherein the antenna forms part of a radiator; and employing an integrated circuit located in the active region.

A method can include one or more of the following features: the integrated circuit comprises a monolithic microwave integrated circuit (MMIC), the MMIC is bare die, the MMIC does not have any wirebond connections, the integrated circuit comprises a (MMIC), wherein the MMIC can comprise a power amplifier, RF switch, low noise amplifier, phase shifter, and/or digital attenuator, a logic layer, wherein the logic layer is connected to the MMIC, the logic layer is connected to the MMIC with a via, a second ground layer, wherein the second ground layer is connected to the patch antenna layer, the second ground layer is connected to the patch antenna layer by a via, the radiator has a thickness of less than or equal to about 2.2 mm, the radiator comprises the antenna, a paint layer on the patch antenna, the integrated circuit including at least one MMIC, a bond film, a laminate layer, a second ground plane layer, a logic layer, and a structural carrier layer, and/or the radiator has a density of less than about 2.0 Kg/m$^2$.

BRIEF DESCRIPTION OF THE DRAWINGS

The foregoing features of this invention, as well as the invention itself, may be more fully understood from the following description of the drawings in which:

FIGS. 9A and 9B are schematic representations of equipment to form shorting posts.

DETAILED DESCRIPTION

Figure 1:
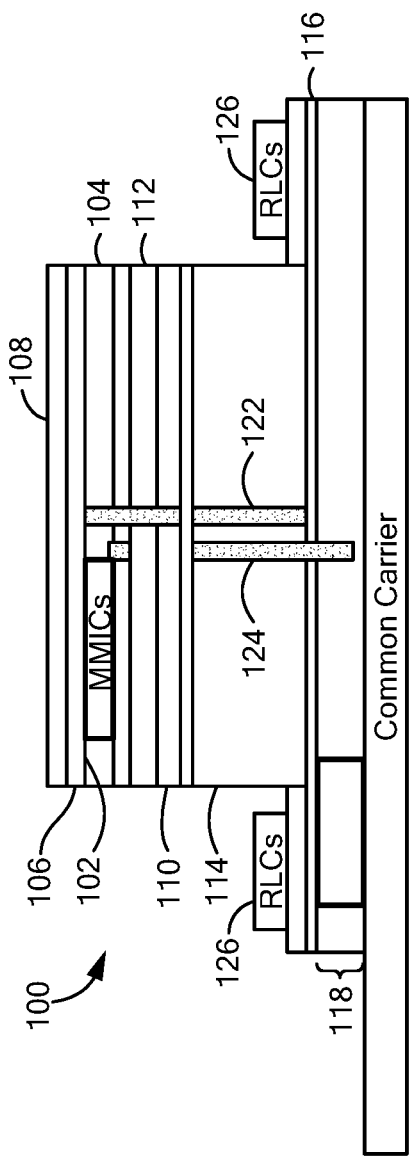
FIGS. 1 and 1A show an example radiator having MMICs located in a cavity below the antenna element.
Figure 1A:
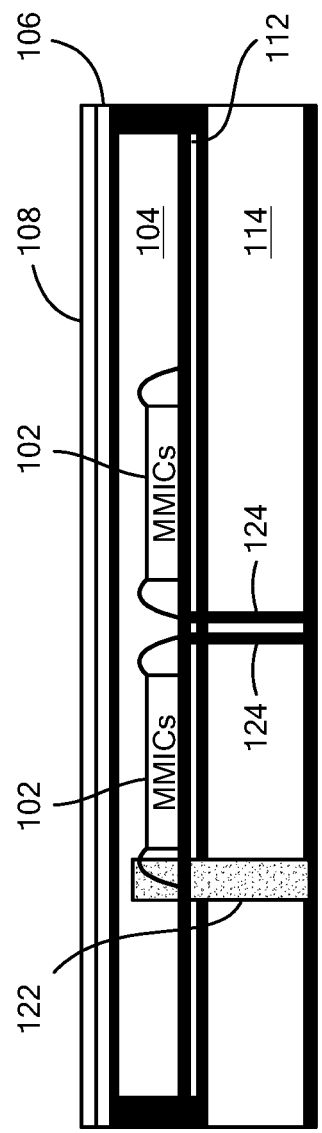

FIGS. 1 and 1A show an example radiator 100 having circuitry within the reactive field region of the radiator. Integrated circuits 102 can include one or more MMICs (Monolithic microwave integrated circuits) in a cavity 104 under a patch antenna layer 106. The patch antenna layer 106 may be covered by a material 108, such as paint having desired characteristics. As is known in the art, MMICs refer to integrated circuits (ICs) that operate at microwave frequencies, e.g., (300 MHz to 300 GHz). Example MMICs include signal mixers, power amplifiers, low noise amplifiers (LNAs), and high-frequency switches. Inputs and outputs on MMIC devices are typically matched to a 50 Ohm impedance.

In the illustrated embodiment, a ground layer 110, which can be provided in stripline, is under the MMICs 102 and separated by a layer 112 of dielectric material. A radiator substrate layer 114, which can be provided as dielectric material, is located between ground layer 110 and a further ground layer 116, which can comprise copper, for example. A logic layer 118 under the ground layer 116 can include digital circuitry and DC power distribution. The logic layer 118 can be located on top of a carrier layer 120.

In embodiments, the patch layer 106 and ground layer 110 provide the patch antenna. The fringing fields from the antenna are responsible for the radiation. The fringing E-fields on the edge of the antenna add up in phase and produce the radiation of the antenna. The current adds up in phase on the patch antenna and an equal current in opposite direction is on the ground plane, which cancels the radiation. The antenna radiation arises from the fringing fields, which are due to the advantageous voltage distribution. That is, the radiation arises due to the voltage and not the current. The patch antenna can be considered a voltage radiator. In embodiments, MMICs 102 are located in the active region between the patch 106 and ground layer 110.

A first via 122 provides a connection from ground layer 116 to the patch radiator 106 and a second via 124 provides a connection from the logic layer 118 to the MMICs 102. In example embodiments, multiple vias are connected to the MMICs 102.

In embodiments, a component module 126 can include various circuit components, such as passive components like resistors, inductors and/or capacitors (RLCs), and can be provided proximate the logic layer 118. It is understood that a variety of circuit components known to one skilled in the art can form a part of the component module 126. For example, as shown in FIGS. 1D-1I, the integrated circuit can comprise a MMIC, and the MMIC can comprise a power amplifier, RF switch, low noise amplifier, phase shifter, and/or digital attenuator.

In embodiments, the MMICs 102 comprise bare die components, e.g., the MMICs do not include packages (encapsulant), which significantly reduces the area and height needed for the MMICs. The MMICs 102 may have printed base connections instead of wirebonds.

Figure 1B:
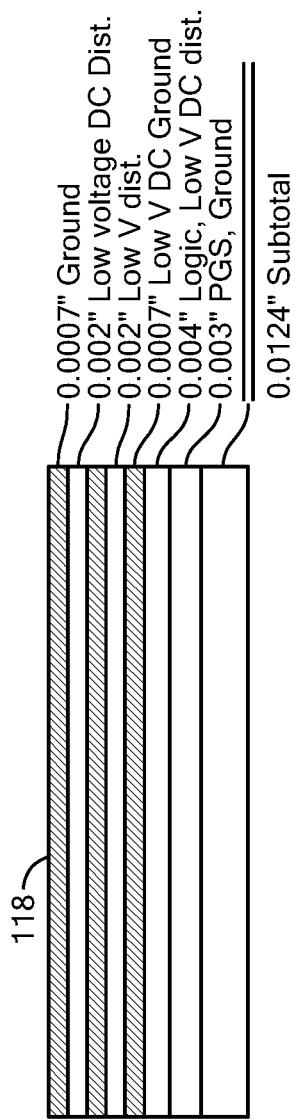
FIG. 1B shows a logic layer of the radiator of FIG. 1 with example dimensions.
Figure 1C:
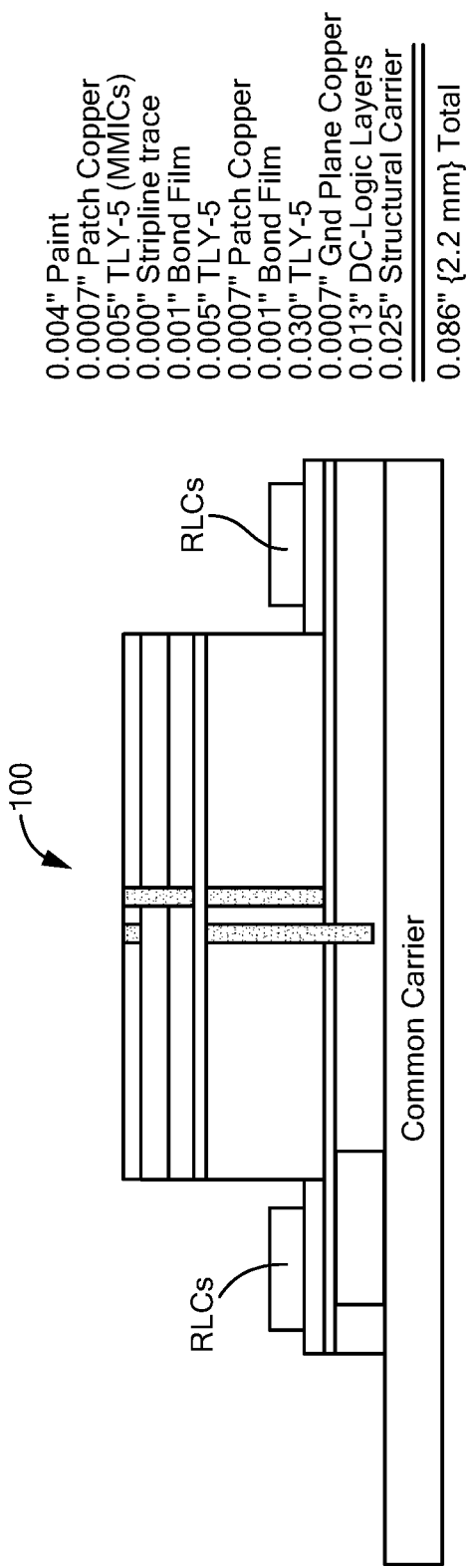
FIG. 1C shows the radiator of FIG. 1 with example dimensions.
Figure 1D:
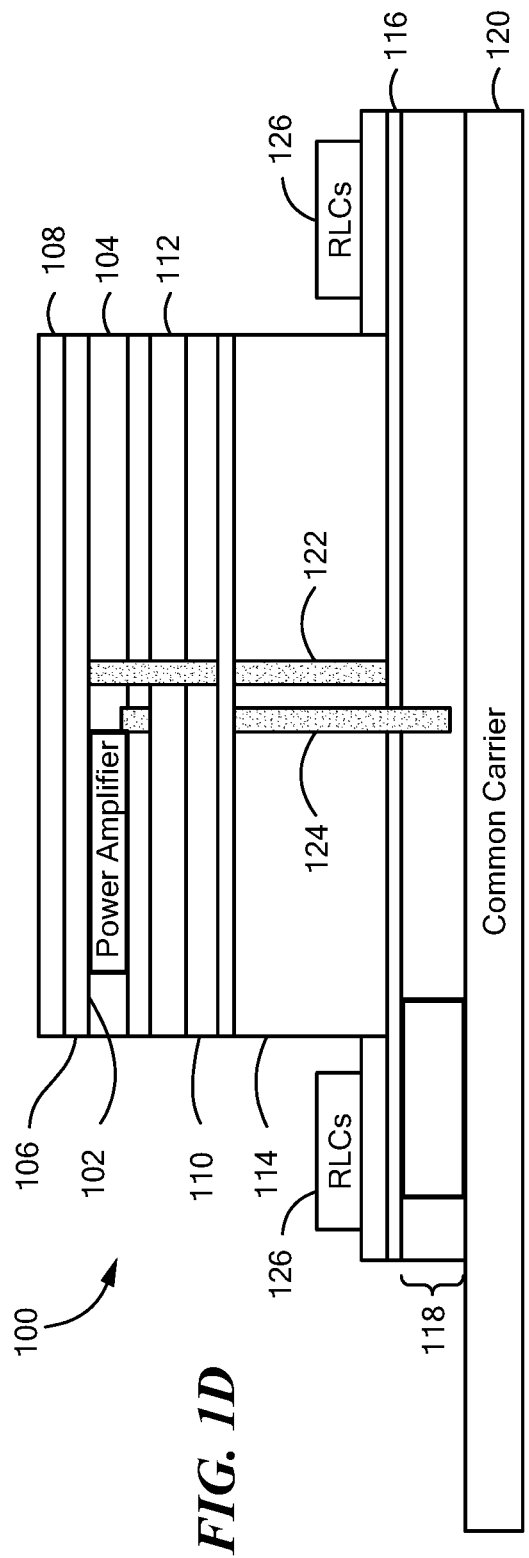
FIGS. 1D-1I shows the radiator of FIG. 1 with a MMIC comprising a power amplifier, RF switch, low noise amplifier, phase shifter, a digital attenuator, and a combination of circuits, respectively.
Figure 1E:
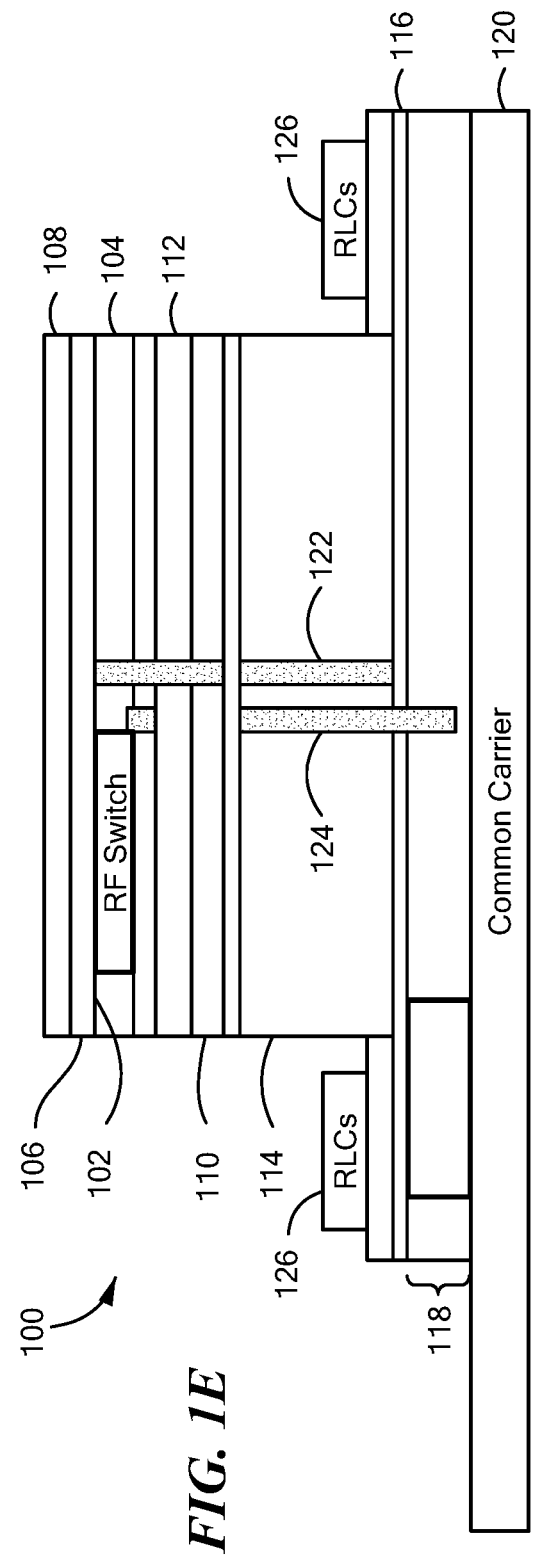
Figure 1F:
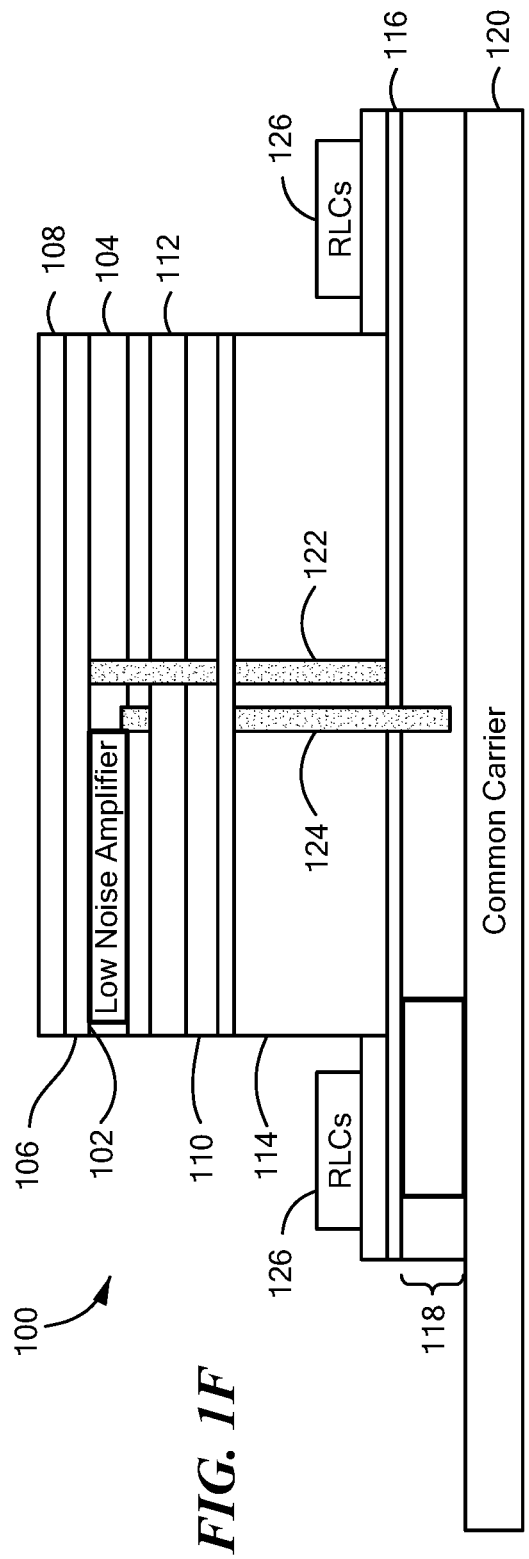
Figure 1G:
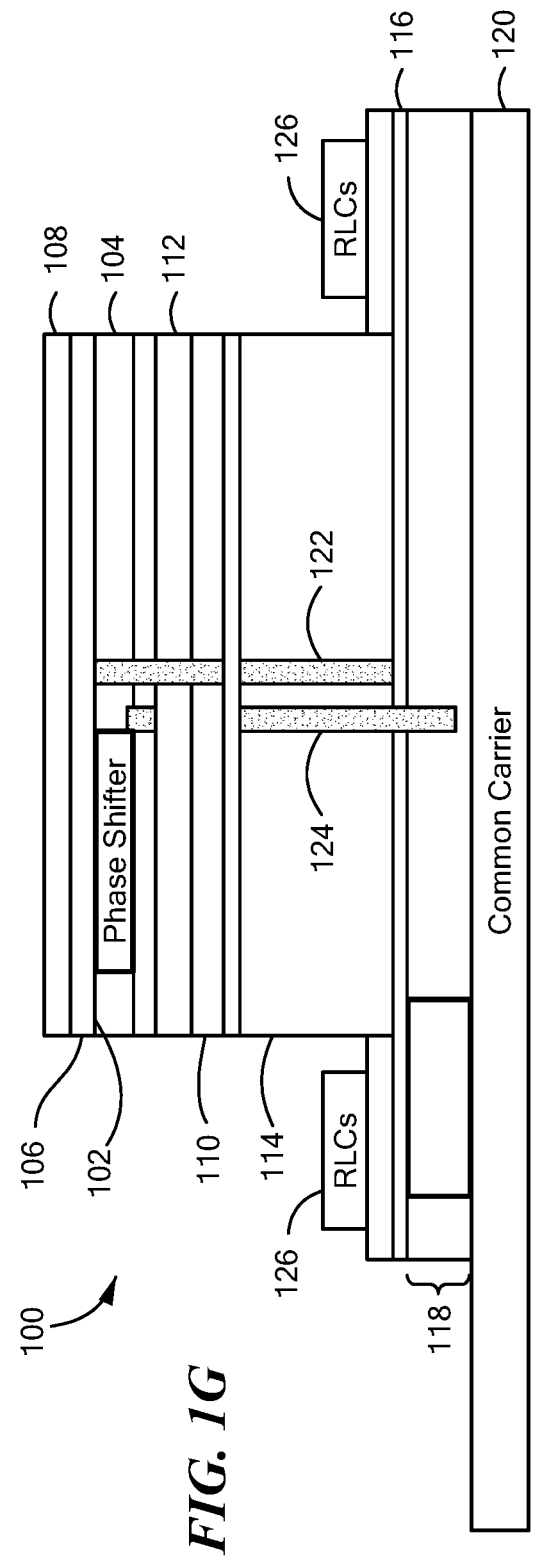
Figure 1H:
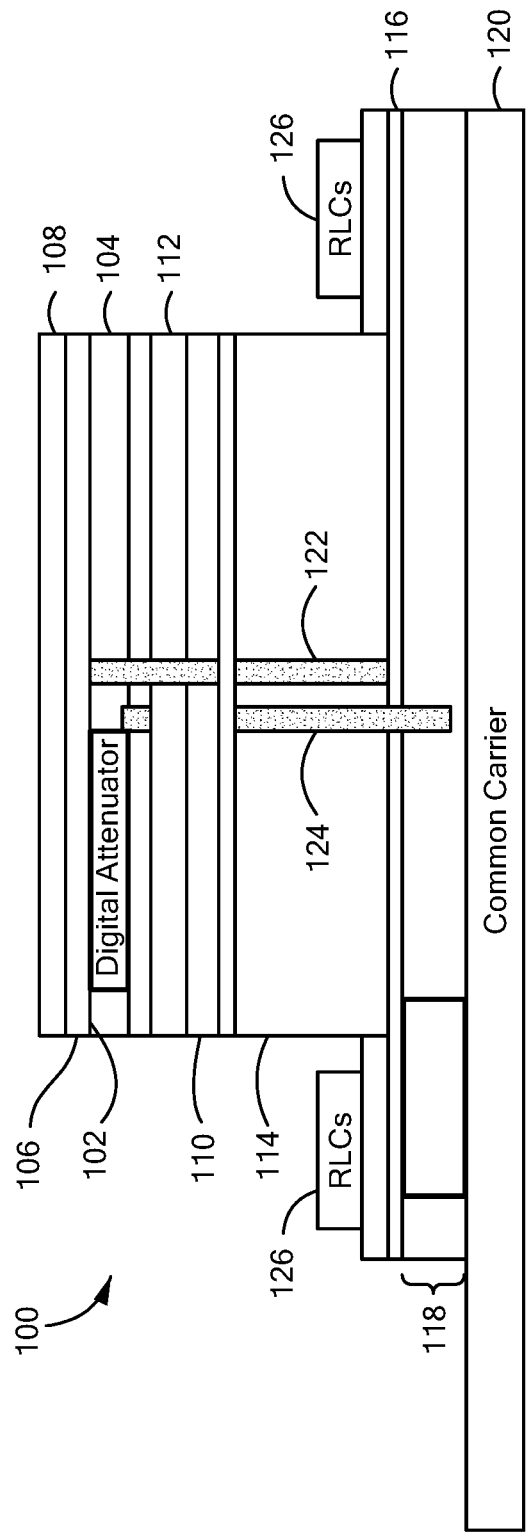
Figure 1I:
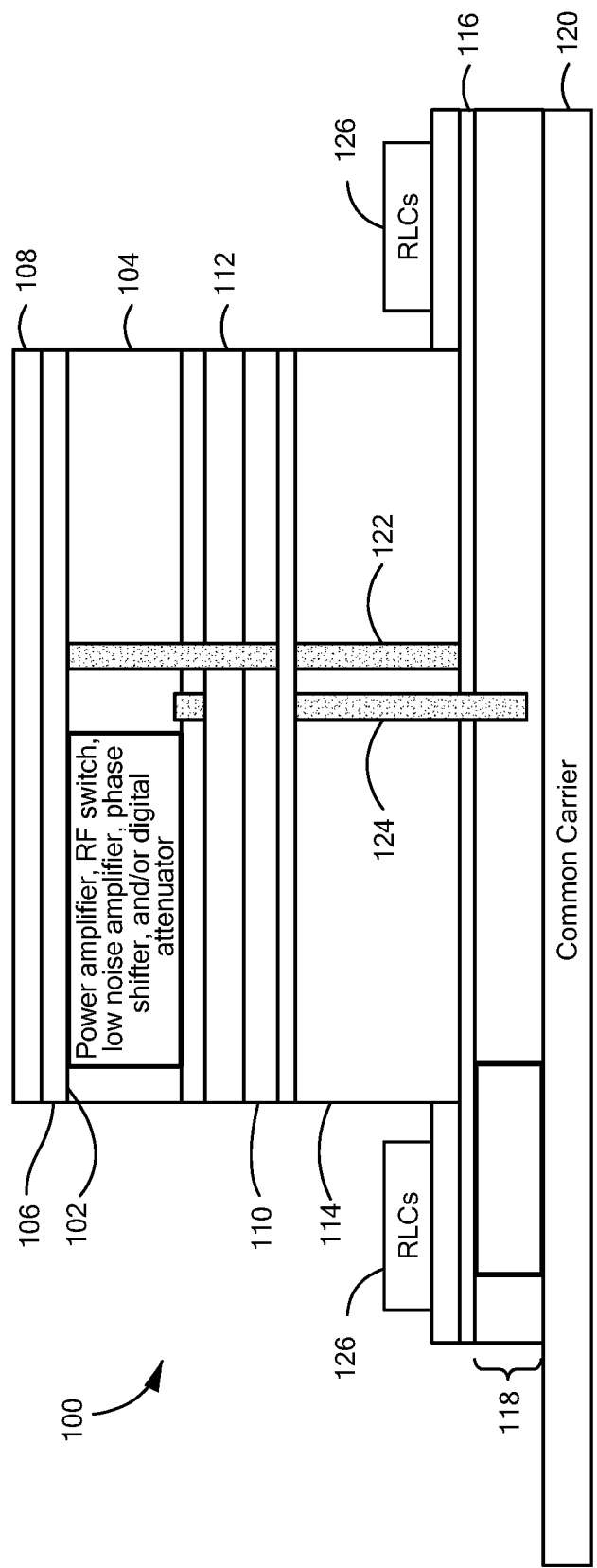

FIG. 1B shows example layers and layer thicknesses for the logic layer 118 of FIG. 1 and FIG. 1C shows example layer thicknesses for the example radiator 100 of FIG. 1. As can be seen, in the illustrated embodiment the total thickness of the example radiator 100 is less than about 0.086 inch (2.2 mm). This thickness is less than any known radiator. In embodiments, an array having radiator embodiments described above can have a weight of less than 2.0 Kg/m$^{2t}$. It is readily understood that such a low weight is highly desirable, for example in weight critical applications including spaced-based and airborne radars. No conventional arrays are known having such a low weight density.

It is understood that TLY-5 in the illustrated embodiment refers to TLY-5 from TACONIC as one example laminate layer material having a dielectric constant in the order of about 2.2 that can be used. Suitable laminates can comprise glass-filled, PTFE composites with woven fiberglass reinforcement. Materials should be low density for low weight requirements.

Figure 2:
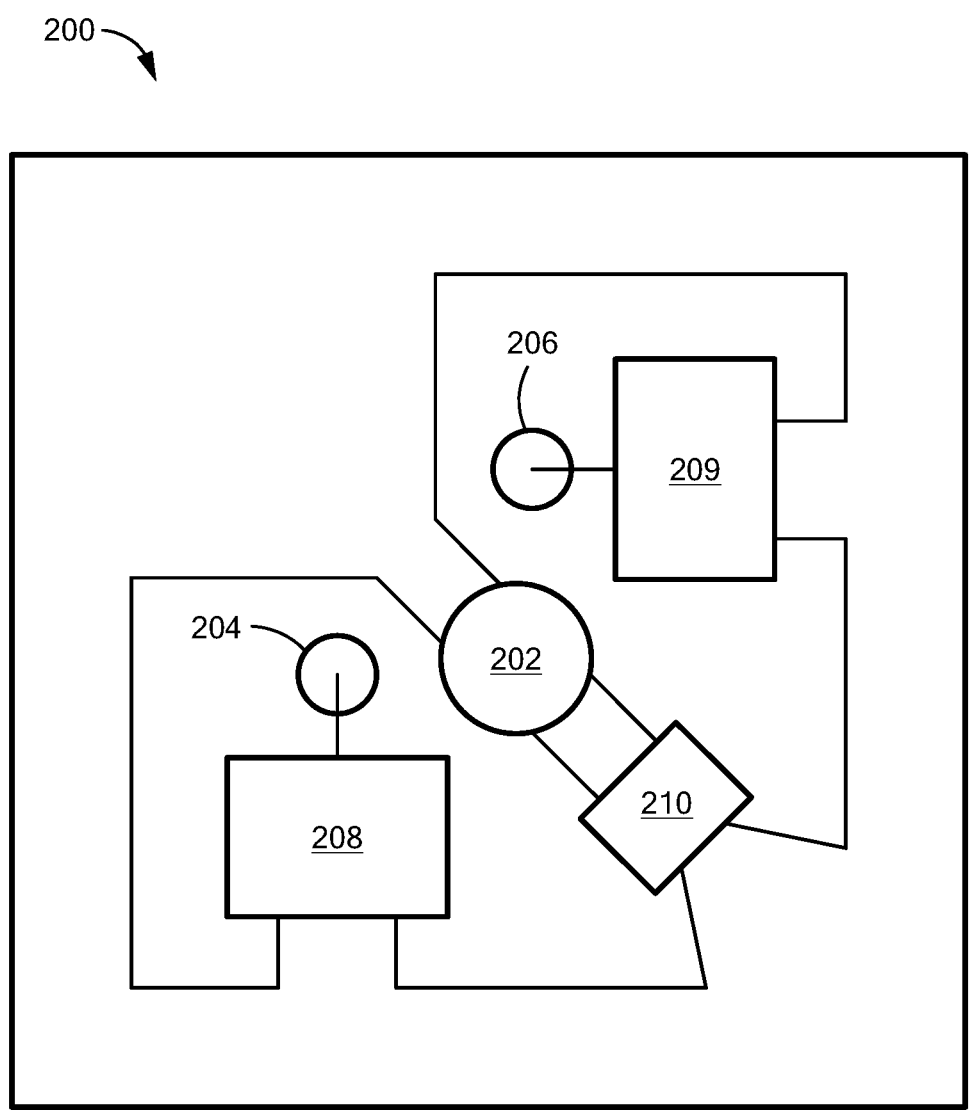
FIG. 2 is a schematic representation of an example circuit that can form a part of the radiator of FIG. 1.

FIG. 2 shows an example circuit 200 that can form a part of the radiator 100 of FIG. 1. A first area 202 provides a via interface into a cavity for the MMICs, such as the MMICs 102 in the cavity 104 of the patch radiator 100 shown in FIG. 1. In the illustrated embodiment, a 4 port assembly 202 brings 4 transmission lines into the patch area from the microwave PWB. These represent transmit and receive for two polarizations. The RX ports pass through a two port LNA 210 and then to RF Switches 208,209 before connecting to the radiator feed. The TX ports connect directly to the RF switches. In example embodiments, the via interface includes four vias. First and second connections 204,206 provide an interface to a patch antenna, such as patch antenna 102 of FIG. 1, which can include V and H polarizations. RF switches 208, 209 are controlled to select between transmit and receive operation for the radiator. A LNA 210 can be selectively coupled to the patch antenna via the switches 208,209 in receive mode. In transmit mode a signal from a power amplifier (not shown) is fed to the patch antenna via the switches 208,209 for transmission into air. The radiator may include mode suppression in the cavity. Example mode suppression configurations can include shorting posts in the cavity, a thin absorber layer above the MMIC circuits, absorber blocks on the PCB, increase MMIC separation, limit amplifier gain, and the like.

Figure 3:
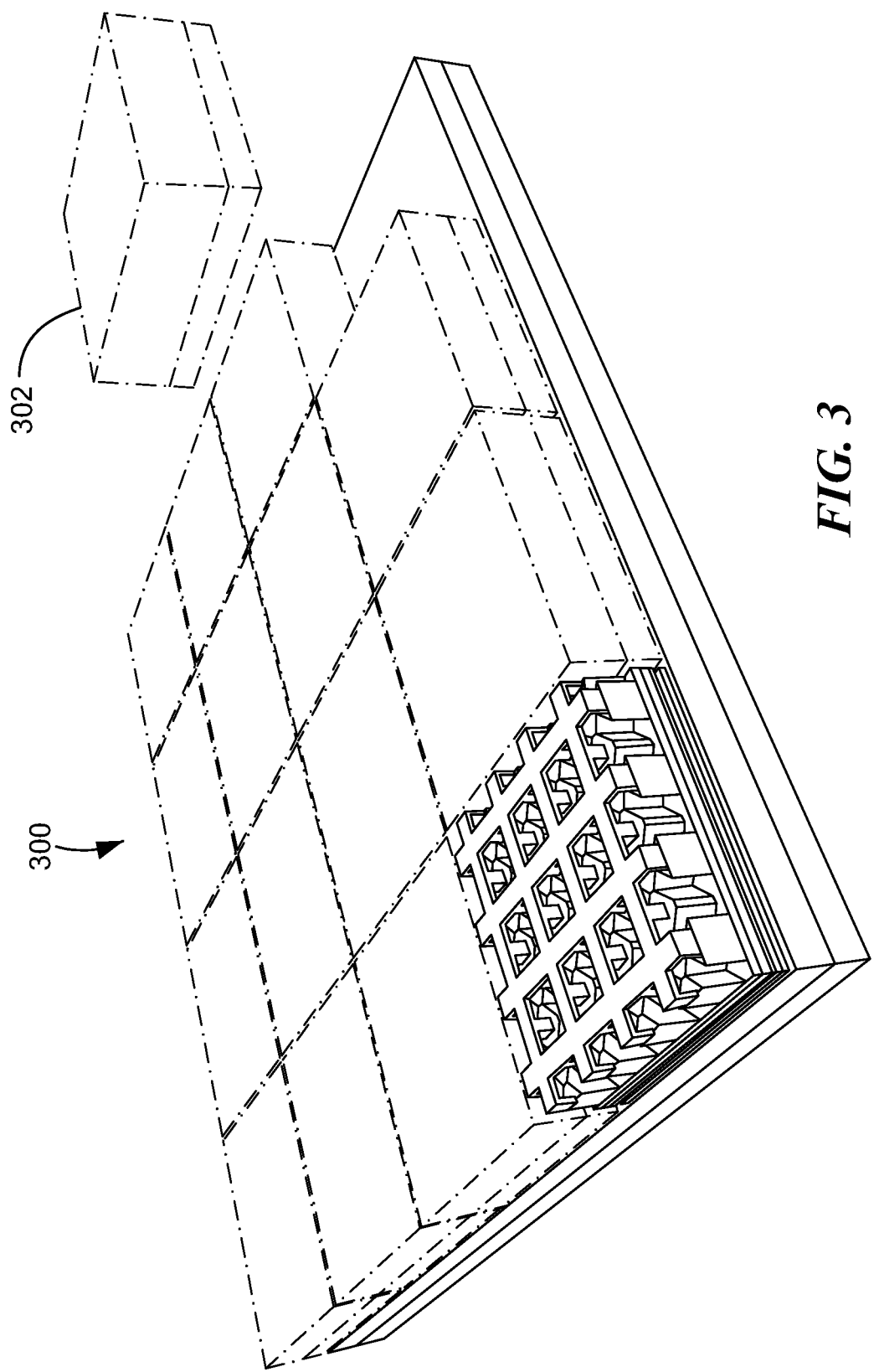
FIG. 3 shows example tiles of radiator elements that can form a phased array antenna.

FIG. 3 shows an illustrative array 300 having example radiator embodiments described above within a tile or sub-array 302 of radiators shown detached from the array. It is understood that embodiments of the radiators can be used in wide variety of antenna arrays.

Example embodiments of a reactive field array can include radiators with integrated bare-die MMICs. In embodiments, circuitry in the MMICs may be relatively simple in order to limit the real estate needed with a patch radiator, for example. Some radiator embodiments are surface mount technology (SMT) compatible and can be integrated into know PCB layout processes.

It will be appreciated that radiator embodiments described above achieve significant weight reduction for phased arrays as compared with conventional radiators, such as in X to Ku Band phased arrays. Such weight reduction enables wearable sensors and communications, desirable aircraft sensors, and new classes of space-based arrays, radars, CubeSATs, and nanoSATs.

It is understood that with regard to embodiments of a radiator reference is sometimes made herein to an array antenna having a particular array shape and/or size (e.g., a particular number of antenna elements) or to an array antenna comprised of a particular number of antenna elements. One of ordinary skill in the art will appreciate, however, that the concepts, circuits and techniques described herein are applicable to various sizes, shapes and types of array antennas.

Thus, although the description provided herein describes the concepts, systems and circuits sought to be protected in the context of a array antenna having a substantially square or rectangular shape and comprised of a elements, each having a substantially square or rectangular-shape, those of ordinary skill in the art will appreciate that the concepts equally apply to other sizes and shapes of array antennas and antenna elements having a variety of different sizes, shapes.

Reference is also sometimes made herein to an array antenna including an antenna element of a particular type, size and/or shape configured for operation at certain frequencies. Those of ordinary skill in the art will recognize, of course, that other antenna shapes may also be used and that the size of one or more antenna elements may be selected for operation at any frequency in the RF frequency range.

It should also be appreciated that the antenna elements can be provided having any one of a plurality of different antenna element lattice arrangements including periodic lattice arrangements (or configurations) such as rectangular, circular square, triangular (e.g. equilateral or isosceles triangular), and spiral configurations as well as non-periodic or other geometric arrangements including arbitrarily shaped lattice arrangements.

Figure 4:
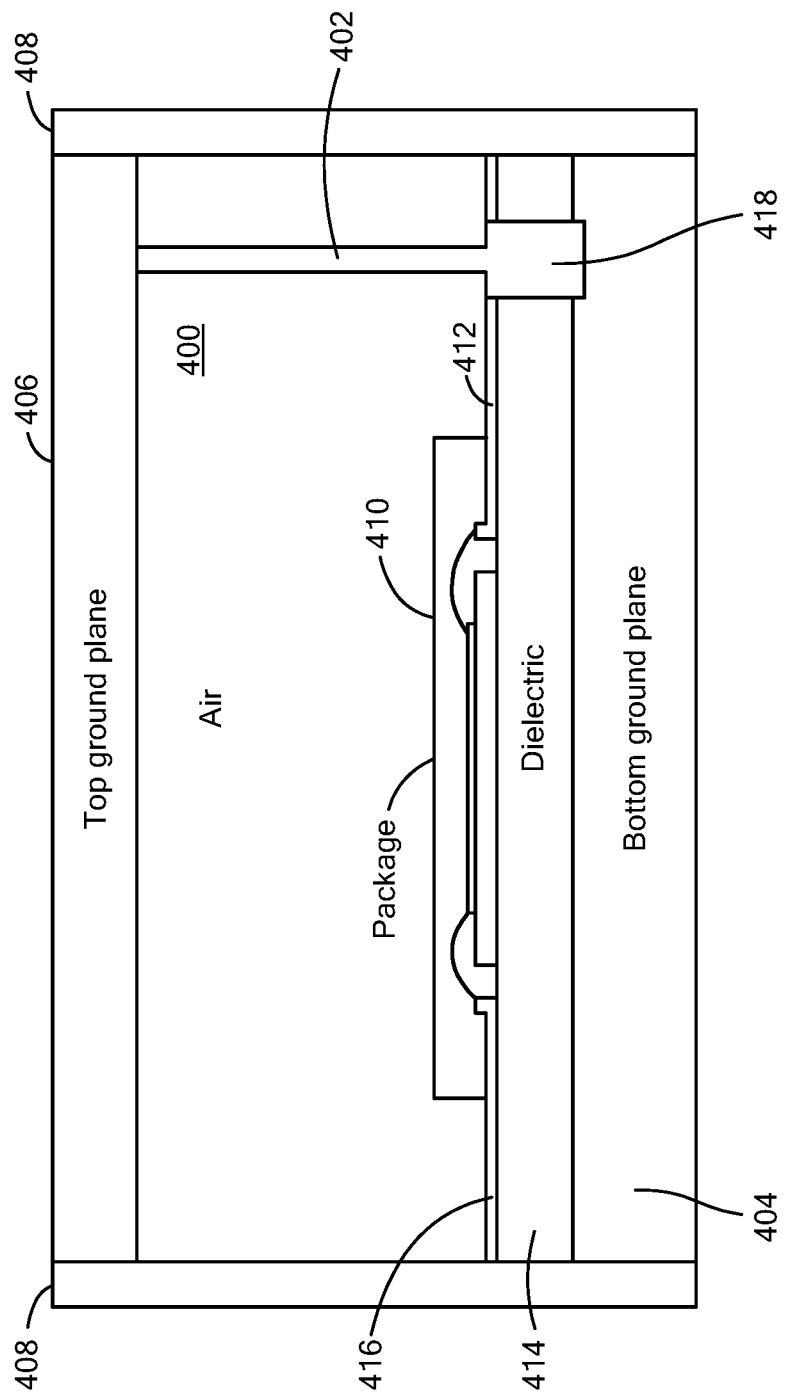
FIG. 4 shows a cavity having a PCB and shorting posts for high order mode suppression.

FIG. 4 shows an example cavity 400 having a shorting post 402 located to achieve high order mode suppression in the cavity. In the illustrated embodiment, the cavity 400 includes a first ground plane 404 that can be considered a bottom ground plane and a second ground plane 406 that can be considered a top ground plane. The cavity 400 is defined by conductive walls 408 at edges of the cavity. An IC 410 is mounted on a surface of a PCB 412 which includes a dielectric layer 414. In the illustrated embodiment, a microstrip feed line 416 is connected to the IC 410. The shorting post 402 extends from the first ground plane 404 by a plated through hole or via 418 into the cavity 400.

Figure 5:
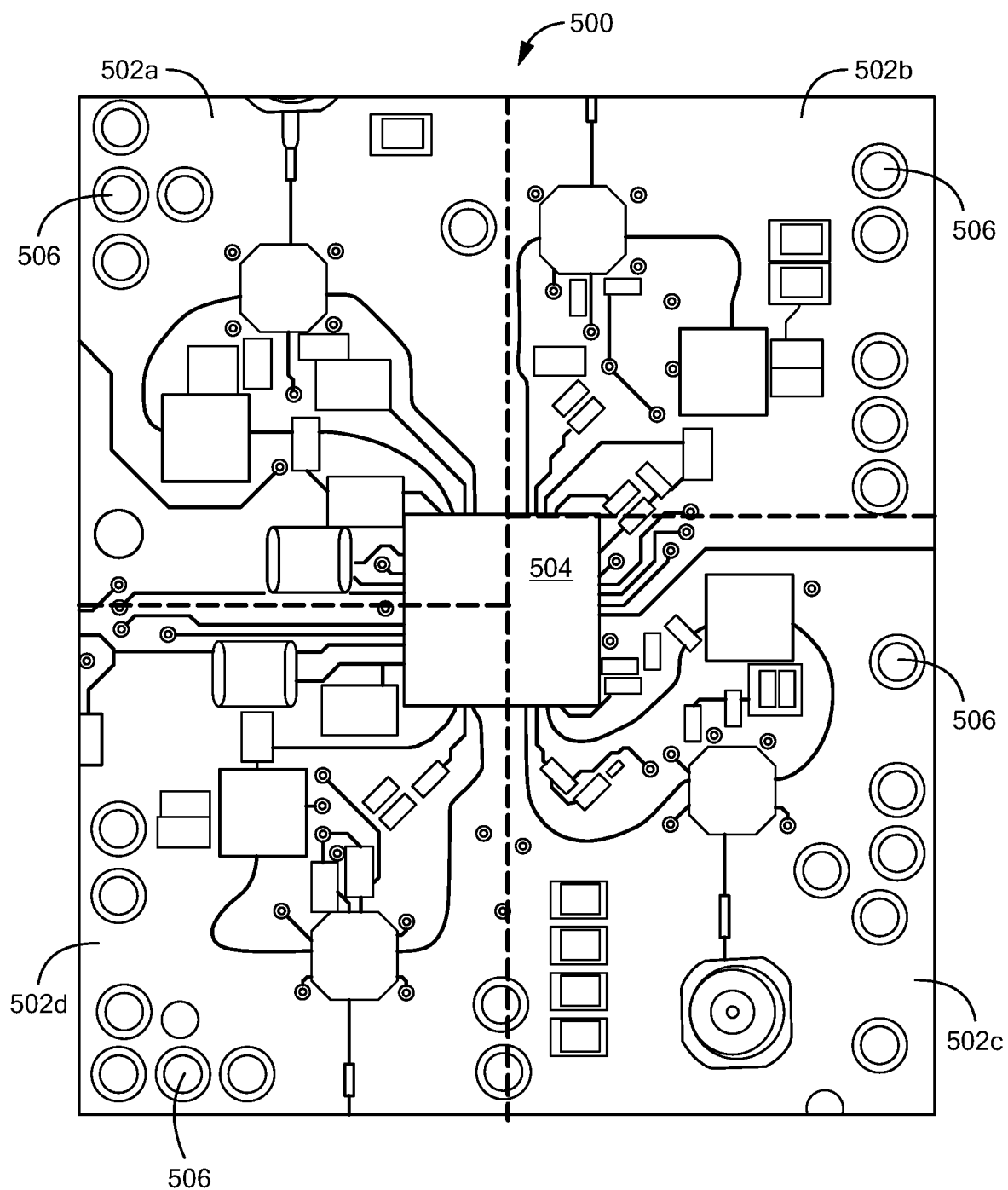
FIG. 5 is a top view of a PCB in a cavity with a 2×2 unit cell having shorting posts.

FIG. 5 shows an example microwave printed circuit board (PCB) 500 with an example 2×2 unit cell so there are four unit cells 502a-d as indicated by the dashed lines. As shown in FIG. 4, the PCB can be located in a cavity surrounded by conductive walls. The PCB includes a number of ICs and components, such as capacitors, resistors, and the like. A first IC 504 is located at the intersection of the unit cells 502. The ICs can include any practical device suited to meet the needs of a particular application. In one particular embodiment, the first IC 504 comprises a beamformer device, such as a 4-1 beamformer, coupled to switches and power and/or low noise amplifiers, for example. A series of plated through holes 506 are shown at various locations. As described more fully herein, shorting posts (not shown) can be located at various locations to reduce higher order mode coupling.

Figure 6A:
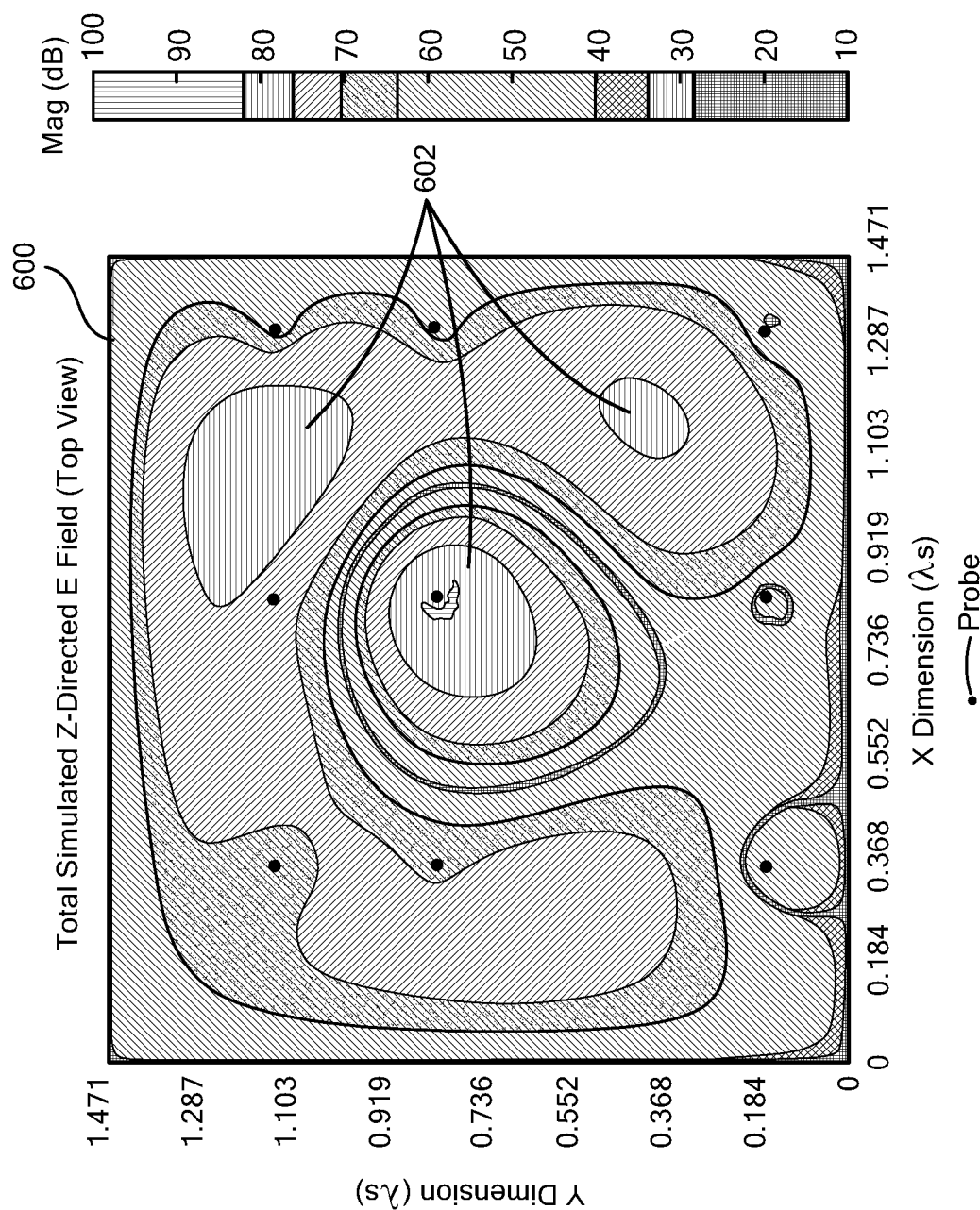
FIG. 6A is a graphical representation of E-field intensity in a cavity without mode suppression.
Figure 6B:
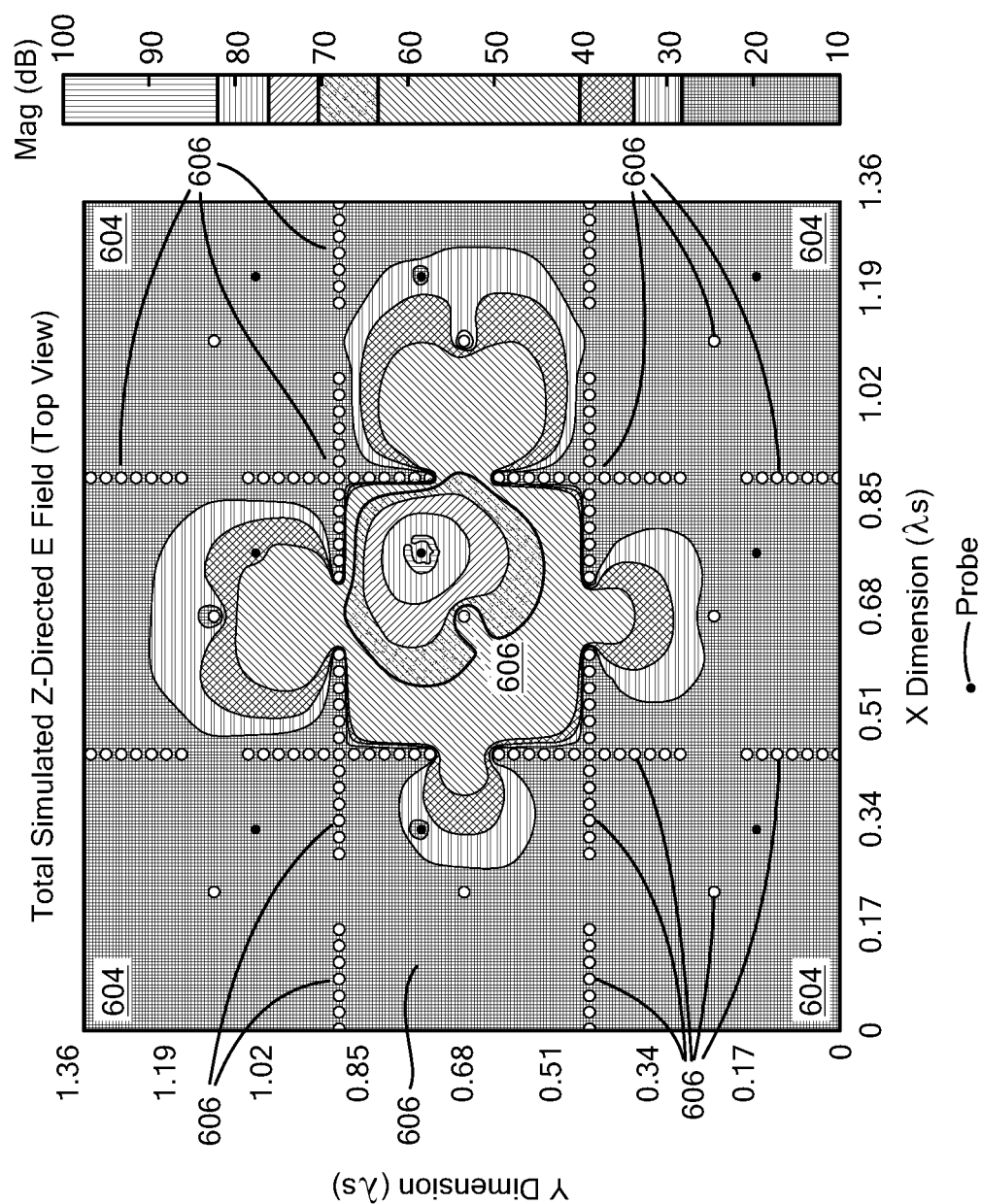
FIG. 6B is a graphical representation of E-field intensity in a cavity with example mode suppression.

FIG. 6A shows a simulated E-field 600 for a PCB in a cavity without mode suppression. As can be seen, there are a number of regions 602 in which there is higher order mode coupling. FIG. 6B shows a simulated E-field for a PCB in a cavity, such as the PCB shown in FIG. 5, with high order mode suppression provided by a series of shorting posts. In the illustrated embodiment, a 30 dB improvement is shown for adjacent unit cell isolation. In the illustrated example mode suppression, there are eight receivers 604 that surround a field generating IC or other source. There are shorting posts 606 located at edges of the unit cells to achieve desired high order mode suppression.

In embodiments, cutoff boundaries are used to place the shorting posts for suppressing high order mode coupling. Such coupling modes are responsible for unexpected electrical problems including impedance mismatch, dispersion, amplifier oscillations, and poor isolation. These problems occur because the cavity mode is often not considered and is difficult to accurately model. As a result, these modes intrude on otherwise expensive and carefully designed circuits, often producing unacceptable electrical performance.

Prior attempts to deal with the high-order mode coupling include inserting thin absorber layers into the microwave PCB assembly, introducing absorber blocks, increasing the separation between microwave and MMICs, and reducing amplifier gain. These methods can provide some performance improvements, but have disadvantages in that they are trial-and-error methods that are not deterministic. As a result, complex microwave circuits often encounter coupling problems that delay design and manufacturing cycles. Absorber blocks may introduce loss in critical circuits, have considerable unit-to-unit variability, and may not be completely effective.

Increasing separation between critical MMICs is generally not practical for high frequency or advanced circuits because of limited real estate, creates new overcrowding PCB layout conditions, and is not always effective. Reducing the amplifier gain degrades overall system performance, increases the risk of manufacturing defects, and limits performance improvements.

Example embodiments of high order mode suppression reduce coupling with minimal effect on the intended TEM propagation. In embodiments, shorting posts are formed using surface mount technology (SMT) techniques that can readily integrate into PCB layout processes.

In embodiments, the PCB design is analyzed using a FEM (finite element method) full wave solver to identify higher order cavity modes. The overall size of the cavity determines the mode composition that forms low loss coupling mechanisms. Conductive shorting posts cut off the cavity mode coupling with little effect on the intended microstrip TEM fields.

By using shorting or grounding posts to create an edge wall around the unit cell, a smaller effect unit cell is generated thereby increasing the minimum resonant frequency of the cavity. In general, the 'wall' created by shorting posts does not need to be continuous. In embodiments, a wall can have a gap, as described more fully below. The size of this gap determines the allowed inter-unit-cell coupling. The shorting posts can be placed within the unit cell to suppress higher-order resonant modes, as well as to address direct, point-to-point coupling due to reactive fields.

Figure 7:
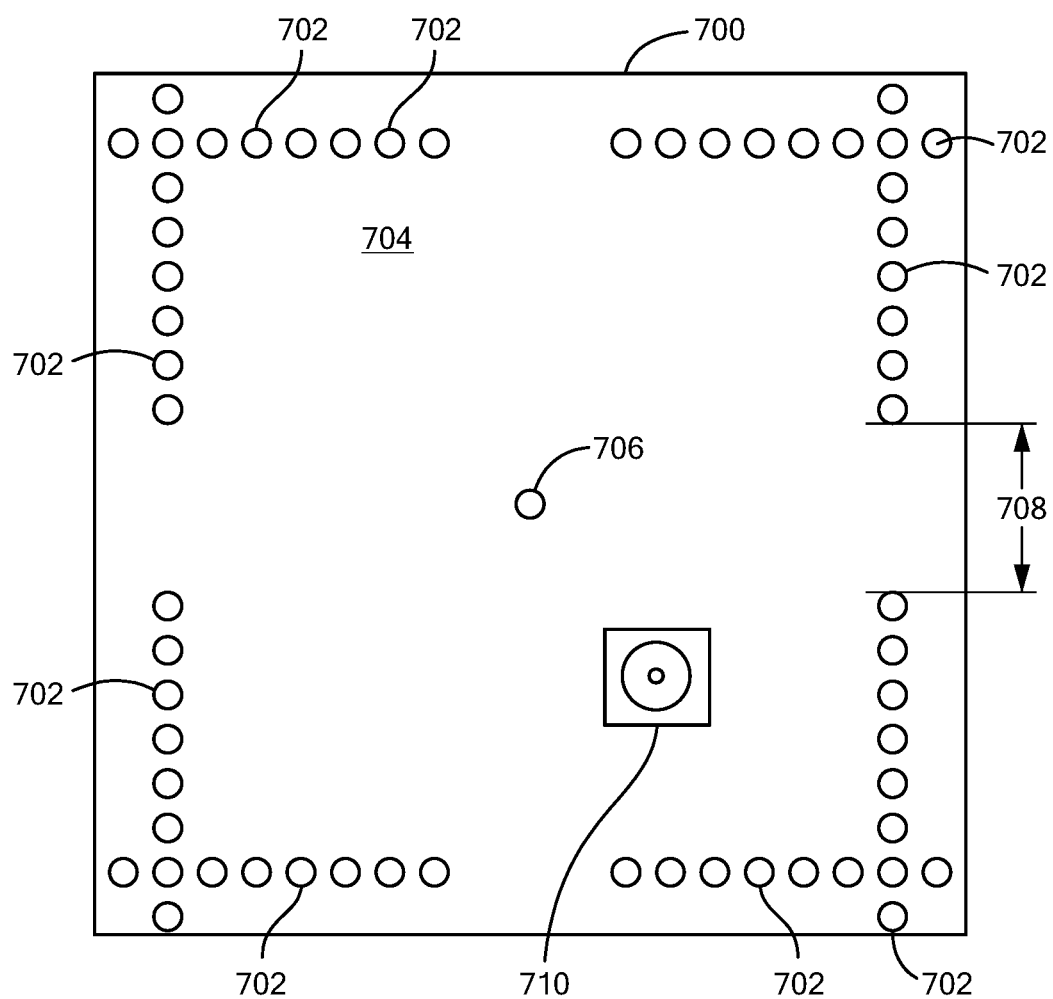
FIG. 7 is a schematic representation of a cavity having an example shorting post distribution with gaps.

FIG. 7 shows an example until cell 700 having a series of shorting posts 702 around a perimeter of the until cell. In the illustrated embodiment, the cavity 704 includes a center shorting post 706. Each side of the cavity 704 can include a gap 708 in which shorting posts 702 are not placed. The gaps 708 should be dimensioned to achieve a desired level of mode suppression. The cavity 704 can include a connector 710, such as a port for a coaxial connection.

Figure 8:
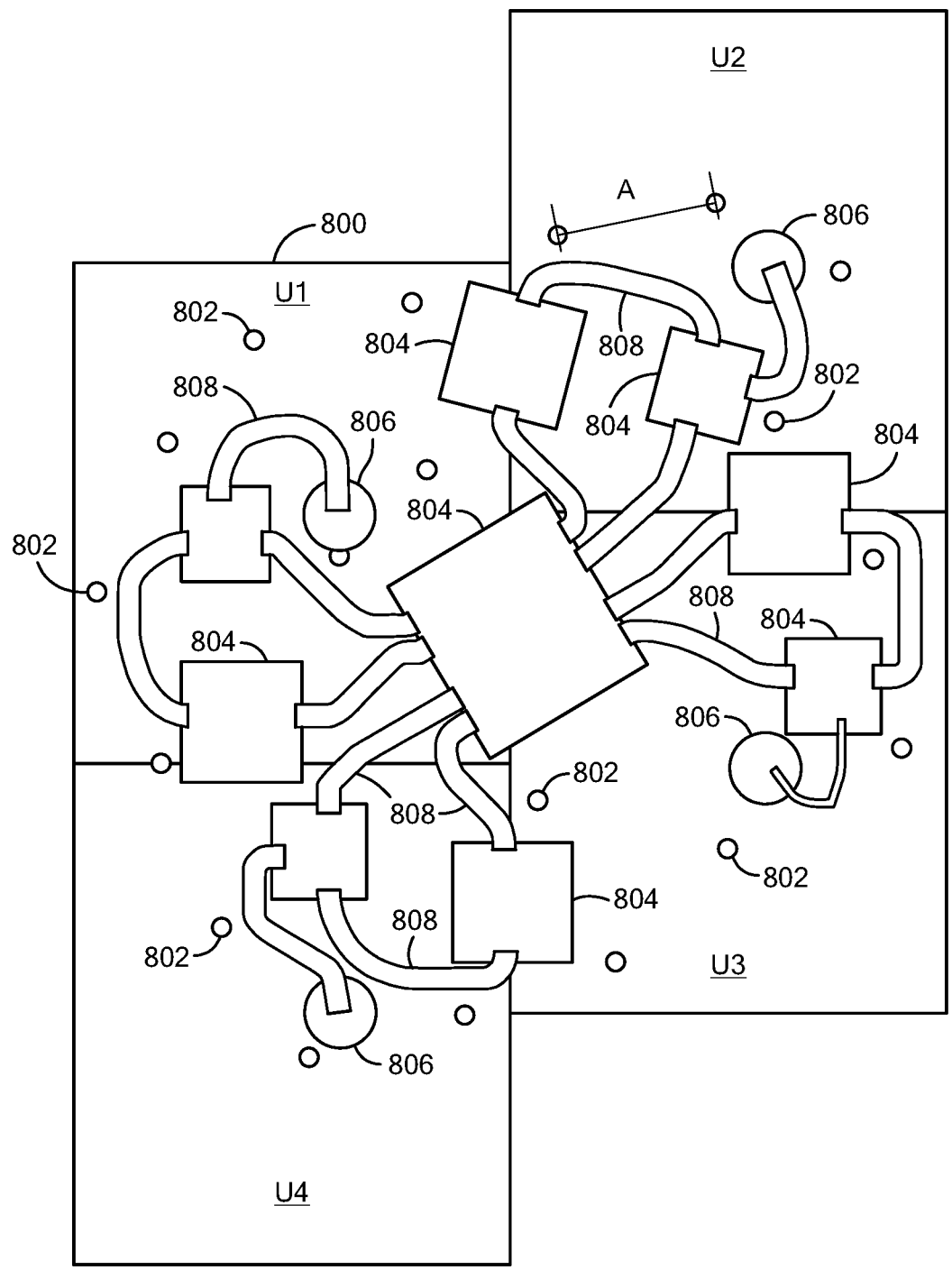
FIG. 8 shows a top view of a notional PCB having ICs and shorting posts.

FIG. 8 shows an example layout for a PCB 800 having a series of shorting posts 802 for high order mode suppression. In the illustrated embodiment, a 2×2 unit cell U1, U2, U3, U4 structure is defined. A number of MMICs 804, which may comprise SMT ICs, are placed on the PCB 800. Output ports 806 can provide external connections for the PCB 800. Traces 808 interconnect the MMICs.

In the illustrated embodiment, the shorting posts 802 are located to form a 'soft' circle for creating a smaller effective cavity to prevent leakage between sets of unit cells. In embodiments, the shorting posts 802 provide a generally circular formation around the ICs 804. In embodiments, the spacing between shorting posts 802, which is shown as dimension A, is approximately λ/5. In embodiments, a mode suppression pin spacing of lambda/5 achieves a 30 dB isolation between unit cells. A lambda/5 or less spacing rule may be applied to a real circuit where the pins must be placed around components and microstrip traces.

The shorting posts 802 within the unit cell reduce coupling within the 2×2 unit cell structure by creating boundary conditions that do not support a low-order/in-band modal field structure and prevent direct reactive field coupling by blocking line-of-sight between points of high coupling, e.g., chip interfaces, transitions to output, etc. The shorting posts 802 can be formed using any suitable technology.

In one embodiment shown in FIGS. 9A and 9B shorting posts are formed using wirebonding systems to form stud bumps. A wire 900 is fed through a needle-like tool 902 which may be referred to as a capillary. A high-voltage electric charge is applied to the wire 900 to melt the wire at the tip of the capillary 902. The tip of the wire 900 forms into a ball 904 because of the surface tension of the molten metal. The ball 904 quickly solidifies and the capillary 902 is lowered to the surface of the chip, which is typically heated to at least 125° C. The machine then pushes down on the capillary 902 and applies ultrasonic energy with an attached transducer. The combined heat, pressure, and ultrasonic energy create a weld between the metal ball and the surface of the chip. A series of balls, which may be referred to as stud bumps, may be stacked on top of each other. The stud bumps can be formed having any practical dimensions to meet the requirements of a particular application. In embodiments, stud bumps can have a diameter in the order of 5 mils.

Figure 10:
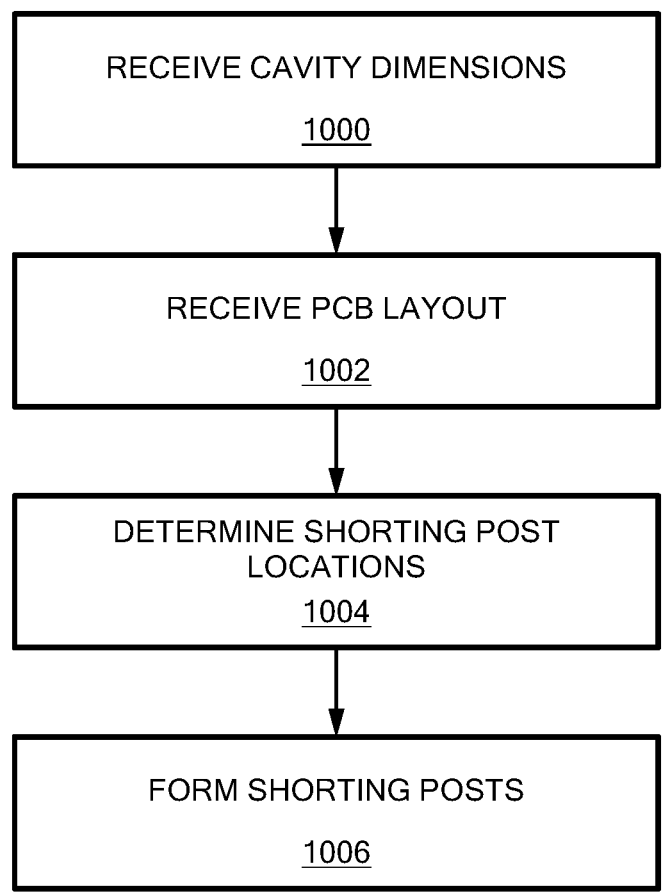
FIG. 10 is a flow diagram showing an example sequence of steps to provide shorting posts for high order mode suppression.

FIG. 10 shows an example sequence of steps for providing higher order mode suppression in a cavity in accordance with example embodiments of the invention. In step 1000, the dimensions of a cavity containing a PCB are received. Example dimensions include length, width, and height of the cavity. In embodiments, the cavity is defined by conductive walls. In step 1002, layout of the PCB is received. For example, the layout can include the location of ICs, components, and the like, on the PCB. In step 1004, locations of shorting posts are determined. In step 1006, the shorting posts are formed at the determined locations to provide the desired higher order mode suppression.

While relative terms, such as "vertical," "above," "below," "lower," "upper," "left," "right," and the like, may be used to facilitate an understanding of example embodiments, such terms are not to limit the scope of the claimed invention in any way. These terms, and any similar relative terms, are not to construed as limiting in any way, but rather, as terms of convenience in describing embodiments of the invention.

Applications of at least some embodiments of the concepts, systems, circuits and techniques described herein include, but are not limited to, military and non-military (i.e. commercial) applications including, but not limited to radar, electronic warfare (EW) and communication systems for a wide variety of applications including ship-based, airborne (e.g. plane, missile or unmanned aerial vehicle (UAV)), and space and satellite applications. It should thus be appreciated that the circuits described herein can be used as part of a radar system or a communications system.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A radiator, comprising:
an antenna comprising a patch antenna layer and a first ground plane layer, wherein the antenna has a reactive field region of the radiator between the patch antenna layer and the first ground plane layer; and
an integrated circuit located in the reactive field region, wherein the radiator has a thickness of less than or equal to 2.2 mm, and wherein the radiator comprises the antenna, a paint layer on the patch antenna, the integrated circuit including at least one monolithic microwave integrated circuit (MMIC), a bond film, a laminate layer, a second ground plane layer, a logic layer, and a structural carrier layer.
2. The radiator according to claim 1, wherein the MMIC is bare die.
3. The radiator according to claim 1, wherein the MMIC does not have any wirebond connections.
4. The radiator according to claim 1, wherein the MMIC comprises a power amplifier, RF switch, low noise amplifier, phase shifter, and/or digital attenuator.
5. The radiator according to claim 1, wherein the logic layer is connected to the MMIC.
6. The radiator according to claim 5, wherein the logic layer is connected to the MMIC with a via.
7. The radiator according to claim 1, wherein the second ground layer is connected to the patch antenna layer.
8. The radiator according to claim 7, wherein the second ground layer is connected to the patch antenna layer by a via.
9. The radiator according to claim 1, wherein the radiator has a density of less than about 2.0 Kg/m$^2$.
10. A method, comprising:
employing an antenna comprising a patch antenna layer and a first ground plane layer, wherein the antenna has a reactive field region of a radiator between the patch antenna layer and the first ground plane layer, wherein the antenna forms part of the radiator; and employing an integrated circuit located in the reactive field region, wherein the radiator has a thickness of less than or equal to 2.2 mm, and wherein the radiator comprises the antenna, a paint layer on the patch antenna, the integrated circuit including at least one monolithic microwave integrated circuit (MMIC), a bond film, a laminate layer, a second ground plane layer, a logic layer, and a structural carrier layer.

11. The method according to claim 10, wherein the MMIC is bare die.

12. The method according to claim 10, wherein the MMIC does not have any wirebond connections.

13. The method according to claim 10, wherein the MMIC comprises a power amplifier, RF switch, low noise amplifier, phase shifter, and/or digital attenuator.

14. The method according to claim 10, wherein the second ground layer is connected to the patch antenna layer.

15. The method according to claim 14, wherein the second ground layer is connected to the patch antenna layer by a via.

* * * * *